US008221939B2

(12) United States Patent
Zable et al.

(10) Patent No.: US 8,221,939 B2
(45) Date of Patent: Jul. 17, 2012

(54) METHOD AND SYSTEM FOR FRACTURING A PATTERN USING CHARGED PARTICLE BEAM LITHOGRAPHY WITH MULTIPLE EXPOSURE PASSES HAVING DIFFERENT DOSAGES

(75) Inventors: Harold Robert Zable, Palo Alto, CA (US); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 289 days.

(21) Appl. No.: 12/647,452

(22) Filed: Dec. 26, 2009

(65) Prior Publication Data
US 2011/0159434 A1   Jun. 30, 2011

(51) Int. Cl.
G03F 1/20        (2012.01)
G03F 1/36        (2012.01)
(52) U.S. Cl. ............. 430/5; 430/30; 430/296; 430/942; 716/53
(58) Field of Classification Search ............... 430/5, 30, 430/296, 942; 716/53
See application file for complete search history.

(56) References Cited

U.S. PATENT DOCUMENTS

| 5,082,762 | A  | 1/1992 | Takahashi |
| 5,103,101 | A  | 4/1992 | Berglund et al. |
| 6,049,085 | A  | 4/2000 | Ema |
| 6,087,046 | A  | 7/2000 | Nakasuji |
| 6,433,348 | B1 | 8/2002 | Abboud et al. |
| 6,544,700 | B2 | 4/2003 | Ogino |
| 6,610,989 | B1 | 8/2003 | Takahashi |

FOREIGN PATENT DOCUMENTS
WO   2010025061 A2   3/2010

OTHER PUBLICATIONS

International Search Report and Written Opinion dated Sep. 9, 2011 for PCT Patent Application No. PCT/US2010/059345.
Martin et al, "New Writing Strategy in Electron Beam Direct Write Lithography to Improve Critical Dense Lines Patterning for Sub-45nm nodes", Proceedings of Spie, 25th European Mask and Lithography Conference, vol. 7420, May 27, 2009 pp. 1-12.
Martin, L. et al., "Development of multiple pass exposure in electron beam direct write lithography for sub-32nm nodes", Proceedings of SPIE, Sep. 23, 2009, pp. 74881C-1-74881C1-12, vol. 7488, SPIE, Bellingham, WA.
U.S. Appl. No. 12/202,366, "Method and System for Design of a Reticle to Be Manufactured Using Character Projection Lithography", Fujimura et al., filed Sep. 1, 2008.
U.S. Appl. No. 12/473,265, "Method and System for Design of a Reticle to Be Manufactured Using Variable Shaped Beam Lithography", Fujimura et al., filed May 27, 2009.
U.S. Appl. No. 12/540,328, "Method for Design and Manufacture of a Reticle Using a Two-Dimensional Dosage Map and Charged Particle Beam Lithography", Fujimura et al., filed Aug. 12, 2009.
U.S. Appl. No. 12/618,722, "Method for Fracturing and Forming a Pattern Using Curvilinear Characters With Charged Particle Beam Lithography", Fujimura et al., filed Nov. 14, 2009.

*Primary Examiner* — Christopher Young
(74) *Attorney, Agent, or Firm* — The Mueller Law Offices, P.C.

(57) ABSTRACT

In the field of semiconductor production using charged particle beam lithography, a method and system for fracturing or mask data preparation or proximity effect correction is disclosed, wherein base dosages for a plurality of exposure passes are different from each other. Methods for manufacturing a reticle and manufacturing an integrated circuit are also disclosed, wherein a plurality of charged particle beam exposure passes are used, with base dosage levels being different for different exposure passes.

25 Claims, 12 Drawing Sheets

METHOD AND SYSTEM FOR FRACTURING A PATTERN USING CHARGED PARTICLE BEAM LITHOGRAPHY WITH MULTIPLE EXPOSURE PASSES HAVING DIFFERENT DOSAGES

RELATED APPLICATIONS

This application: 1) is related to U.S. patent application Ser. No. 12/647,453 filed Dec. 26, 2009 entitled "Method and System For Fracturing a Pattern Using Charged Particle Beam Lithography With Multiple Exposure Passes Which Expose Different Surface Area"; and 2) is related to U.S. patent application Ser. No. 12/647,454 filed Dec. 26, 2009 entitled "Method and System For Fracturing a Pattern Using Charged Particle Beam Lithography With Multiple Exposure Passes"; both of which are hereby incorporated by reference for all purposes.

BACKGROUND OF THE DISCLOSURE

The present disclosure is related to lithography, and more particularly to methods for using a charged particle beam writer to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. In character projection (CP), there is a stencil in the system that has in it a variety of apertures or characters which may be rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs is less than that for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writer is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

There are a number of technologies used for forming patterns on a reticle, including using optical lithography or charged particle beam lithography. If charged particle beam lithography is used, the total writing time increases with the number of shots. Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

A layout pattern, such as a post-OPC pattern, must be decomposed or fractured into a set of VSB and/or CP shots so that a charged particle beam writer can expose the pattern onto a surface using the set or list of shots. Conventional fracturing tools generate a set of non-overlapping or disjoint shots of constant dosage, the dosage subject to later adjustment by proximity effect correction (PEC). Some charged particle beam writers require that the pre-PEC shot dosage be constant, since they do not allow dosage assignment on a shot-by-shot basis. Such charged particle beam writers perform PEC correction internally after reading the input shot list. More recently, U.S. patent application Ser. No. 12/202, 366, filed Sep. 1, 2008 and entitled "Method and System For Design Of A Reticle To Be Manufactured Using Character Projection Lithography", and U.S. patent application Ser. No. 12/473,265, filed May 27, 2009 and entitled "Method And System For Design Of A Reticle To Be Manufactured Using Variable Shaped Beam Lithography" disclose fracturing methods using overlapping shots.

The cost of charged particle beam lithography is directly related to the time required to expose a pattern on a surface, such as a reticle or wafer. Conventionally, the exposure time is related to the number of shots required to produce the pattern. For the most complex integrated circuit designs, forming the set of layer patterns, either on a set of reticles or on a substrate, is a costly and time-consuming process. Therefore, there exists a need to reduce the time required to form complex patterns, such as curvilinear patterns, on a reticle and other surfaces, such as by reducing the number of shots required to form these complex patterns and by overcoming shot overlap and shot dosage limitations of charged particle beam writer systems.

SUMMARY OF THE DISCLOSURE

A method and system for fracturing or mask data preparation or proximity effect correction is disclosed, wherein a plurality of exposure passes, each with a plurality of shots, is determined. Each exposure pass has a base dosage level, with the base dosage levels being different for different exposure passes.

Methods for manufacturing a reticle and for manufacturing an integrated circuit are also disclosed, wherein a plurality of charged particle beam exposure passes are used, with base dosage levels being different for different exposure passes.

The methods of the current disclosure can increase the number of dosage levels with which the reticle or other surface can be exposed when using some types of charged particle beam writers. The increased number of dosage levels can allow for a reduced number of shots required to form patterns.

BRIEF DESCRIPTION OF THE DRAWINGS

FIG. 4A illustrates a square pattern;

FIG. 4B illustrates a pattern resulting from OPC processing of the FIG. 4A square pattern;

FIG. 4C illustrates a conventional fracturing of the pattern of FIG. 4B;

FIG. 7C illustrates eight dosage values that may be obtained with two exposure passes, using shots from only one of the exposure passes for a single area;

DETAILED DESCRIPTION OF THE EMBODIMENTS

The present disclosure describes generating and exposing a series of shaped beam charged particle beam shots to form a desired pattern on a surface. The shots are written in multiple exposure passes, wherein any one or more of the following is true:

The base dosage levels of different exposure passes may be different;

The sum of the base dosage levels of all the exposure passes may be different from a normal dosage; or The union of shot outlines from one exposure pass may be different than the union of shot outlines from a different exposure pass.

Figure 1:
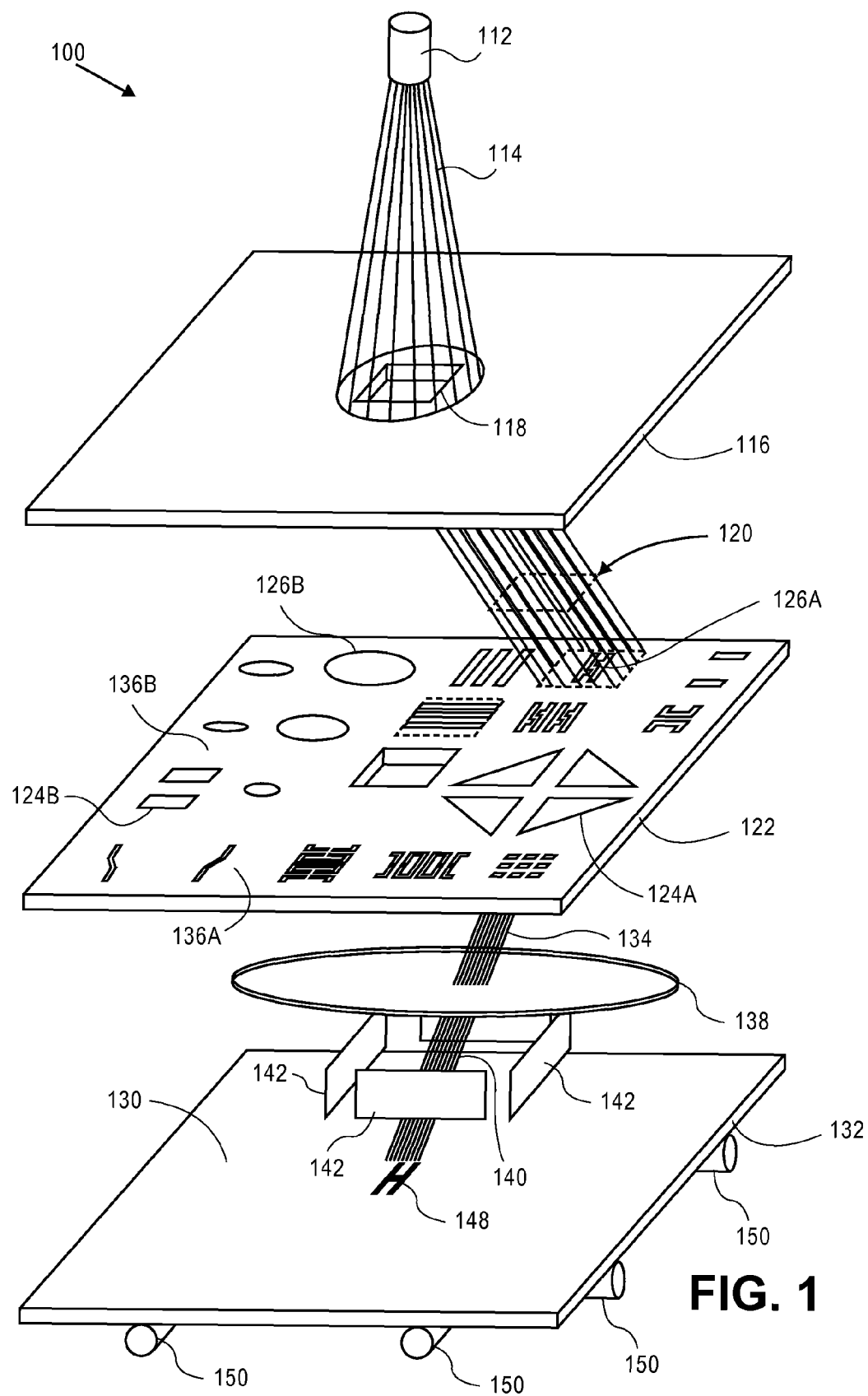
FIG. 1 illustrates a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of subfields, where a sub-field is within the beam deflection capability of the deflection plates 142. The electron beam writer system 100 contains a positioning mechanism 150 to allow positioning the substrate 132 for each of the stripes and subfields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

The shot dosage of a charged particle beam writer such as an electron beam writer system is a function of the intensity of the beam source 112 and the exposure time for each shot. Typically the beam intensity remains fixed, and the exposure time is varied to obtain variable shot dosages. The exposure time may be varied to compensate for various proximity effects, some longer-range and some shorter-range, in a process called proximity effect correction (PEC). Electron beam writer systems usually allow setting an overall dosage, called a base dosage, that affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before proximity effects correction. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which either do not allow dosage assignment on a shot-by-shot basis, or which allow assignment of one of a relatively few dosage levels.

Figure 2A:
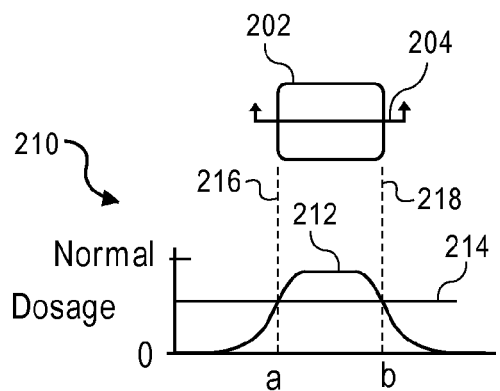
FIG. 2A illustrates a single charged particle beam shot and a cross-sectional dosage graph of the shot.
Figure 2B:
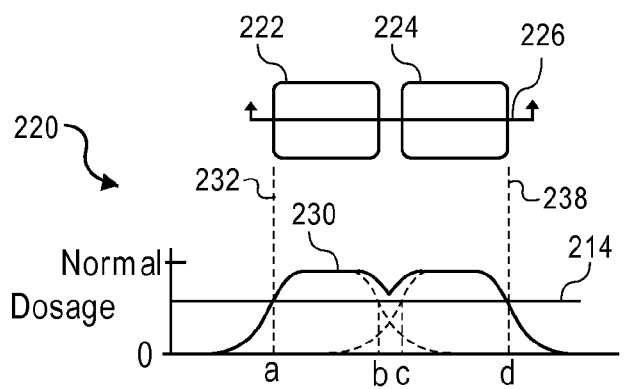
FIG. 2B illustrates a pair of proximate shots and a cross-sectional dosage graph of the shot pair.

FIGS. 2A-B illustrate how energy is registered on a resist-coated surface from one or more charged particle beam shots. In FIG. 2A a rectangular pattern 202 illustrates a shot outline, which is a pattern that will be produced on a resist-coated surface from a shot which is not proximate to other shots. In dosage graph 210, dosage curve 212 illustrates the cross-sectional dosage along a line 204 through shot outline 202. Line 214 denotes the resist threshold, which is the dosage above which the resist will register a pattern. As can be seen from dosage graph 210, dosage curve 212 is above the resist threshold between the X-coordinates "a" and "b". Coordinate "a" corresponds to dashed line 216, which denotes the left-most extent of the shot outline 202. Similarly, coordinate "b" corresponds to dashed line 218, which denotes the right-most extent of the shot outline 202. The shot dosage for the shot in the example of FIG. 2A is a normal dosage, as marked on dosage graph 210. In conventional mask writing methodology, the normal dosage is set so that a relatively large rectangular shot will register a pattern of the desired size on the resist-coated surface. The normal dosage therefore depends on the value of the resist threshold 214.

FIG. 2B illustrates the shot outlines of two particle beam shots, and the corresponding dosage curve. Shot outline 222 and shot outline 224 result from two proximate particle beam shots. In dosage graph 220, dosage curve 230 illustrates the dosage along the line 226 through shot outlines 222 and 224.

Figure 2C:
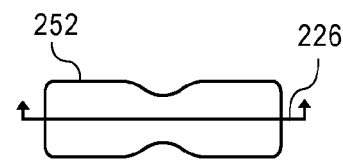
FIG. 2C illustrates a pattern formed on a resist-coated surface from the pair of FIG. 2B shots.

As shown in dosage curve 230, the dosage registered by the resist along line 226 is the combination, such as the sum, of the dosages from two particle beam shots, represented by shot outline 222 and shot outline 224. As can be seen, dosage curve 230 is above the threshold 214 from X-coordinate "a" to X-coordinate "d". This indicates that the resist will register the two shots as a single shape, extending from coordinate "a" to coordinate "d". FIG. 2C illustrates a pattern 252 that the two shots from the example of FIG. 2B may form.

When using conventional non-overlapping shots using a single exposure pass, conventionally all shots are assigned a normal dosage before PEC dosage adjustment. A charged particle beam writer which does not support shot-by-shot dosage assignment can therefore be used by setting the base dosage to a normal dosage. If multiple exposure passes are used with such a charged particle beam writer, the base dosage is conventionally set according to the following equation:

base dosage=normal dosage/# of exposure passes

Figure 3A:
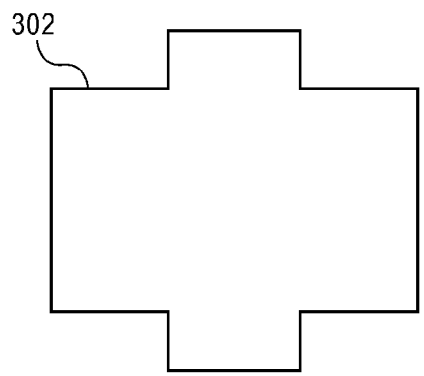
FIG. 3A illustrates a polygonal pattern.
Figure 3B:
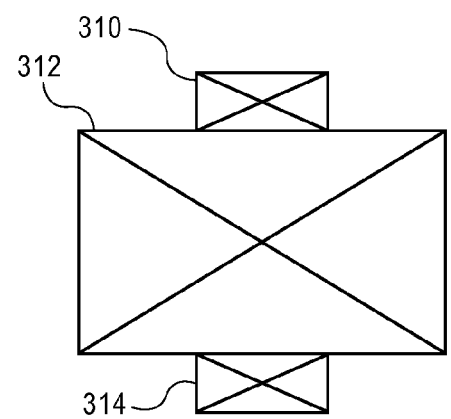
FIG. 3B illustrates a conventional fracturing of the polygonal pattern of FIG. 3A.
Figure 3C:
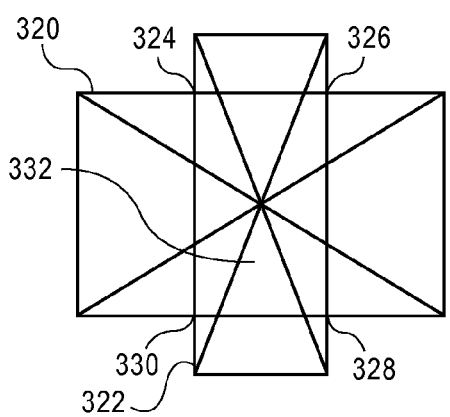
FIG. 3C illustrates an alternate fracturing of the polygonal pattern of FIG. 3A.

FIGS. 3A-C illustrate two known methods of fracturing a polygonal pattern. FIG. 3A illustrates a polygonal pattern 302 that is desired to be formed on a surface. FIG. 3B illustrates a conventional method of forming this pattern using non-overlapping or disjoint shots. Shot outline 310, shot outline 312 and shot outline 314 are mutually disjoint. Additionally, the three shots associated with these shot outlines all use a desired normal dosage, before proximity correction. An advantage of using the conventional method as shown in FIG. 3B is that the response of the resist can be easily predicted. Also, the shots of FIG. 3B can be exposed using a charged particle beam system which does not allow dosage assignment on a shot-by-shot basis, by setting the base dosage of the charged particle beam writer to the normal dosage. FIG. 3C illustrates an alternate method of forming the pattern 302 on a resist-coated surface using overlapping shots, disclosed in U.S. patent application Ser. No. 12/473,265, filed May 27, 2009 and entitled "Method And System For Design Of A Reticle To Be Manufactured Using Variable Shaped Beam Lithography." In FIG. 3C the constraint that shot outlines cannot overlap has been eliminated, and shot 320 and shot 322 do overlap. In the example of FIG. 3C, allowing shot outlines to overlap allows forming the pattern 302 in only two shots, compared to the three shots of FIG. 3B. In FIG. 3C, however, the response of the resist to the overlapping shots is not as easily predicted as in FIG. 3B. In particular, the interior corners 324, 326, 328 and 330 may register as excessively rounded because of the large dosage received by region 332. Charged particle beam simulation may be used to determine the pattern 332 registered by the resist. In one embodiment, charged particle beam simulation may be used to calculate the dosage for each grid location in a two-dimensional (X and Y) grid, creating a grid of calculated dosages called a dosage map. The results of charged particle beam simulation may indicate use of non-normal dosages for shot 320 and shot 322.

Figure 4D:
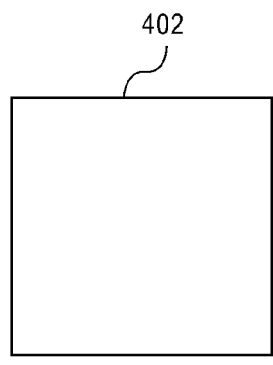
FIG. 4D illustrates an exemplary fracturing of the pattern of FIG. 4B.
Figure 4D:
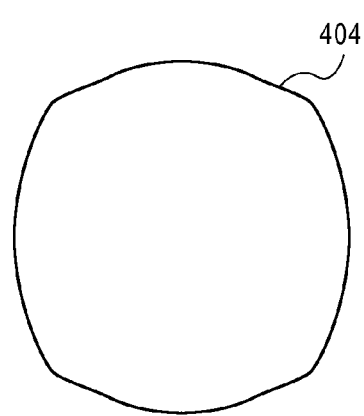
Figure 4D:
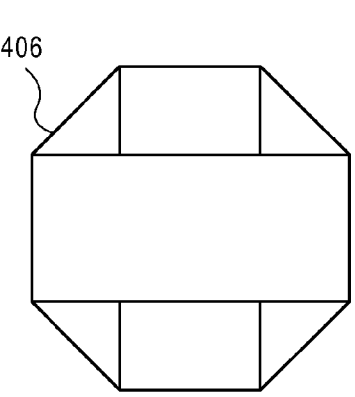
Figure 4D:
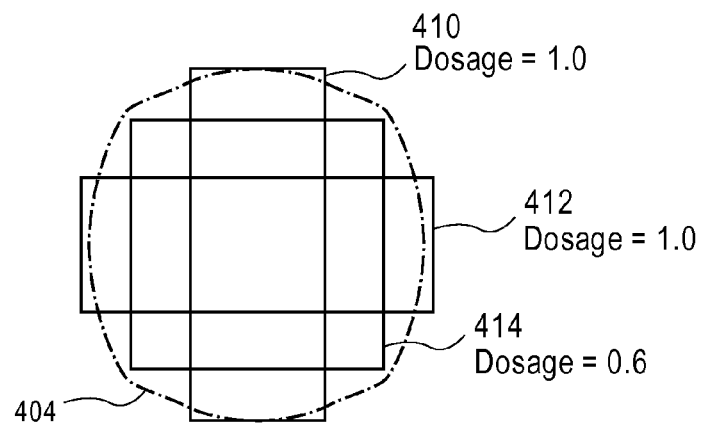

FIGS. 4A-D illustrate examples of various known ways of forming a curvilinear pattern on a resist-covered surface. FIG. 4A illustrates an example of a square pattern 402, such as a contact or via for an integrated circuit design, that may be desired to be formed on a resist-coated surface. A large integrated circuit may contain millions of contact shapes. Pattern 402 is an original design pattern, before OPC processing. If advanced OPC processing, such as ILT, is performed on pattern 402, a pattern 404 of FIG. 4B may result. FIG. 4C illustrates an example of a conventional method for forming the pattern 404 using a set of non-overlapping, normal-dosage VSB shots 406. Shot set 406 shows the shot outlines of seven shots, including both rectangular and triangular VSB shots. The pattern registered by shot set 406 may not match the desired pattern 404 very closely, but the use of more than seven shots per contact may be considered impractical. FIG. 4D illustrates shot outlines of an example of three overlapping shots that can more accurately form pattern 404 than can the shot set 406. This method of overlapping shots is disclosed in the aforementioned U.S. patent application Ser. No. 12/473,265. In the set of three shots, shot 410 and shot 412 has a normal dosage, and shot 414 has a dosage of 0.6 times a normal dosage. Charged particle beam simulation may be used to determine the result that will be registered by the resist using shots 410, 412 and 414. The solution of FIG. 4D, however, cannot be conventionally implemented when using a charged particle beam writer which does not allow dosage assignment on a per-shot basis. If the base dosage for the writing system is set to a normal dosage divided by a predetermined number of exposure passes, then shot 410 and shot 412 can be made with the proper total dosage, but shot 414 cannot be made. Neither can the solution of FIG. 4D be conventionally implemented when using a charged particle beam writer which does not allow shots to overlap.

To overcome limitations presented by a charged particle beam writer that does not allow dosage to be assigned for each shot, the current invention novelly enables the solution of FIG. 4D to be implemented by using multiple exposure passes. For example, for FIG. 4D, a solution can be obtained using two exposure passes. Shot 410 and shot 412 may be written in one exposure pass which has a base dosage level of 1.0 times a normal dosage, and shot 414 may be written in another exposure pass which has a base dosage of 0.6 times a normal dosage. In addition to the base dosages being different between the two exposure passes, it should be noted that the sum of base dosage levels from the two exposure passes does not equal a normal dosage, unlike with a conventional multi-pass exposure technique. Additionally, the union of the shots for the two exposure passes is different, with one exposure pass including shot 410 and shot 412 and a different exposure pass including shot 414.

Figure 5A:
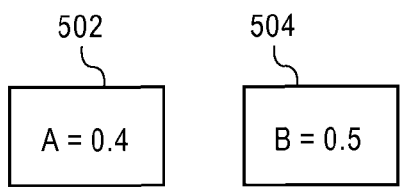
FIG. 5A illustrates shots from each of two exposure passes.
Figure 5B:
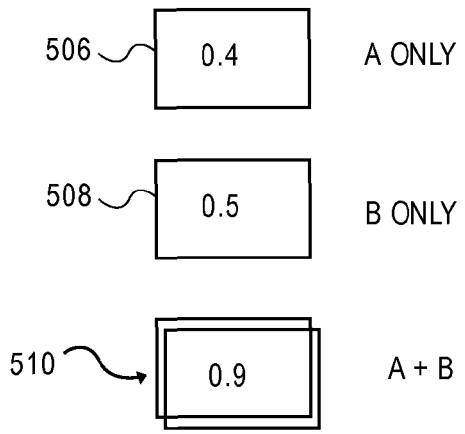
FIG. 5B illustrates three dosage values that may be obtained from no more than one shot from each of the two exposure passes of FIG. 5A.

When using multiple exposure passes, each exposure pass after the first pass adds an overhead in total write time. This forms a practical limit to the number of exposure passes. When using a charged particle beam writer which either does not allow dosage assignment on a per-shot basis, or which provides a very few available shot dosages, it is therefore advantageous to maximize the number of available shot dosages using the fewest number of exposure passes. FIGS. 5A-D illustrate an example of how a multi-pass writing technique may be used to expose a resist-coated surface with multiple dosage values, using a particle beam writer that does not allow dosage assignment on a per-shot basis. FIG. 5A illustrates a single shot outline 502 from an exposure pass called pass "A", and a single shot outline 504 from an exposure pass called pass "B". Shots in pass "A" have an assigned dosage of 0.4 times a normal dosage, and shots in pass "B" have an assigned dosage of 0.5 times a normal dosage. In the most restrictive case, the charged particle beam writer may not allow shots to overlap within an exposure pass. FIG. 5B illustrates that three total dosages are available in this most-restrictive case, using two exposure passes:

0.4 times normal dosage using one shot from pass "A" only, illustrated by shot outline 506;

0.5 times normal dosage using one shot from pass "B" only, illustrated by shot outline 508; and 0.9 times normal dosage using one shot from pass "A" and one superimposed shot from pass "B", illustrated by the pair of overlapping shot outlines 510.

Figure 5C:
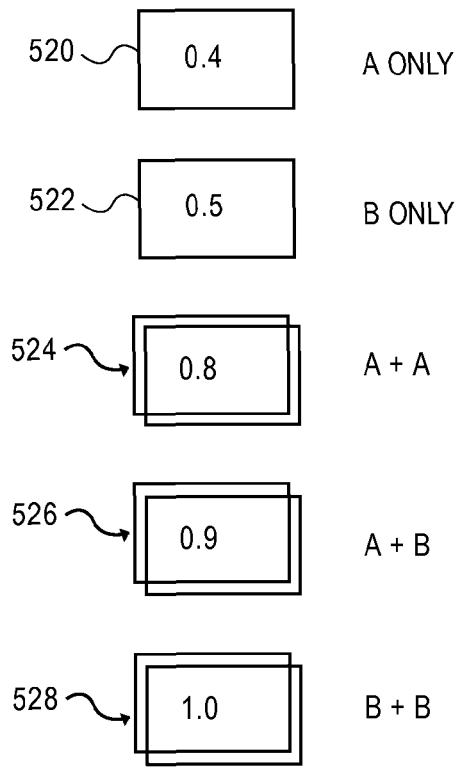
FIG. 5C illustrates five dosage values that may be obtained from no more than two shots among the two exposure passes of FIG. 5A.

FIG. 5C illustrates that five total dosages are available using two shots in a less-restrictive case where the charged particle beam writer allows shots to overlap within an exposure pass:

- 0.4 times normal dosage using one shot from pass "A" only, illustrated by shot outline 520;
- 0.5 times normal dosage using one shot from pass "B" only, illustrated by shot outline 522;
- 0.8 times normal dosage using two overlapping shots from pass "A", illustrated by the pair of overlapping shot outlines 524;
- 0.9 times normal dosage using one shot from pass "A" and one shot from pass "B", illustrated by the pair of overlapping shot outlines 526; and
- 1.0 times normal dosage using two overlapping shots from pass "B", illustrated by the pair of overlapping shot outlines 528.

Figure 5D:
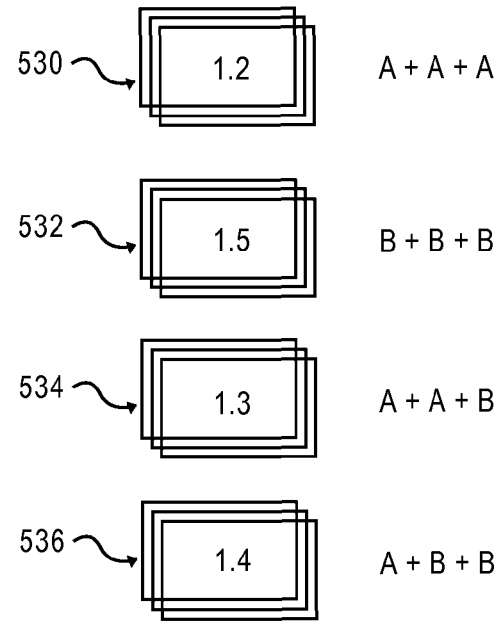
FIG. 5D illustrates four dosage values that may be obtained by using three shots among the two exposure passes of FIG. 5A.

FIG. 5D illustrates four additional dosages that are available by using three overlapping shots:

- 1.2 times normal dosage using three shots from pass "A", illustrated by the trio of overlapping shot outlines 530;
- 1.5 times normal dosage using three shots from pass "B", illustrated by the trio of overlapping shot outlines 532;
- 1.3 times normal dosage using two shots from pass "A" and one shot from pass "B", illustrated by the trio of overlapping shot outlines 534; and
- 1.4 times normal dosage using one shot from pass "A" and two shots from pass "B", illustrated by the trio of overlapping shot outlines 536.

Larger numbers of dosage values may be obtained using three or more exposure passes. It should be noted that some of the conventional goals of multi-pass exposure—i.e. accuracy-improvement—may still be achieved when a plurality of shots having a similar dosage are used, such as in shot pair 510, shot pair 524, shot pair 526 or shot pair 528. In these four shot pairs, the dosages of the two shots in the shot pair are within 35% of each other, constituting similar dosages. Single shots, such as shot 506, shot 508, shot 520 or shot 522 do not gain any accuracy improvement, since the surface is exposed during only one of the two passes. Additional multi-exposure accuracy improvement, if needed, can be obtained by combining conventional multi-pass exposure with the technique disclosed above, using additional exposure passes.

Figure 6A:
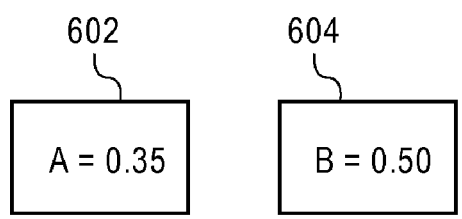
FIG. 6A illustrates shots from each of two exposure passes.
Figure 6B:
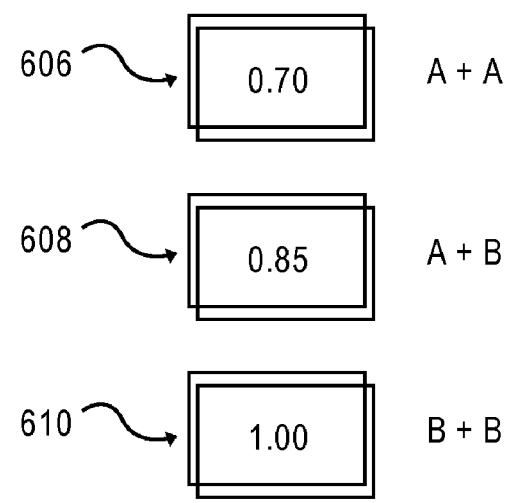
FIG. 6B illustrates three dosage values that may be obtained using exactly two shots among the two exposure passes of FIG. 6A.

FIGS. 6A-B illustrate another example of using multi-pass exposure. FIG. 6A illustrates shot 602 from a pass "A" which has a base dosage level of 0.35 times a normal dosage, and shot 604 from a pass "B" which has a base dosage level of 0.50 times a normal dosage. FIG. 6B illustrates three shot combinations of similar-dosage shots, wherein a reduction in some kinds of writing accuracy errors can be obtained. Shot combination 606 consists of two superimposed shots from pass "A", totaling a dosage of 0.7 times a normal dosage. Shot combination 608 consists of two superimposed shots, one from pass "A" and one from pass "B", totaling a dosage of 0.85 times a normal dosage. Shot combination 610 consists of two superimposed shots from pass "B", totaling a dosage of 1.0 times a normal dosage. FIG. 6B illustrates how multiple dosages may be delivered to the resist-coated surface, while still gaining the some of the accuracy-improvement benefit of conventional multi-pass exposure.

Figure 7A:
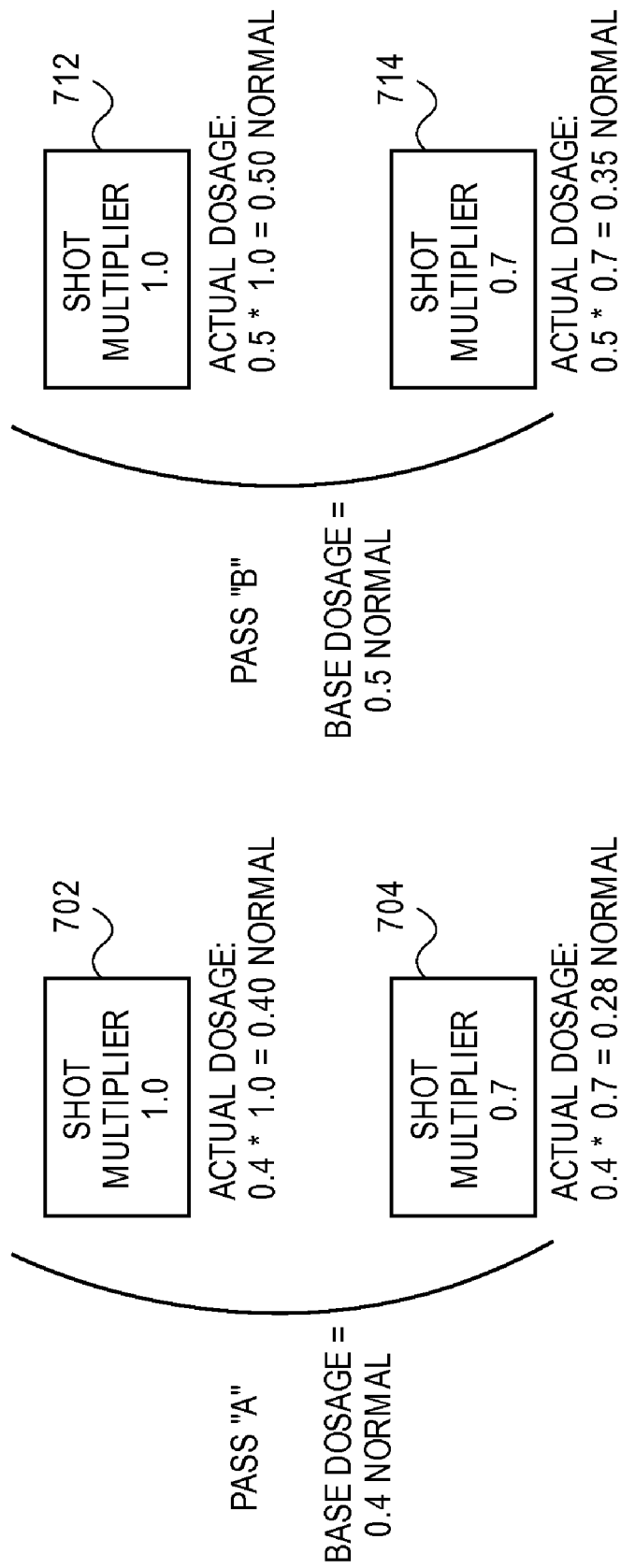
FIG. 7A illustrates four dosage values that may be obtained with two exposure passes, using two shot dosages for each exposure pass.
Figure 7B:
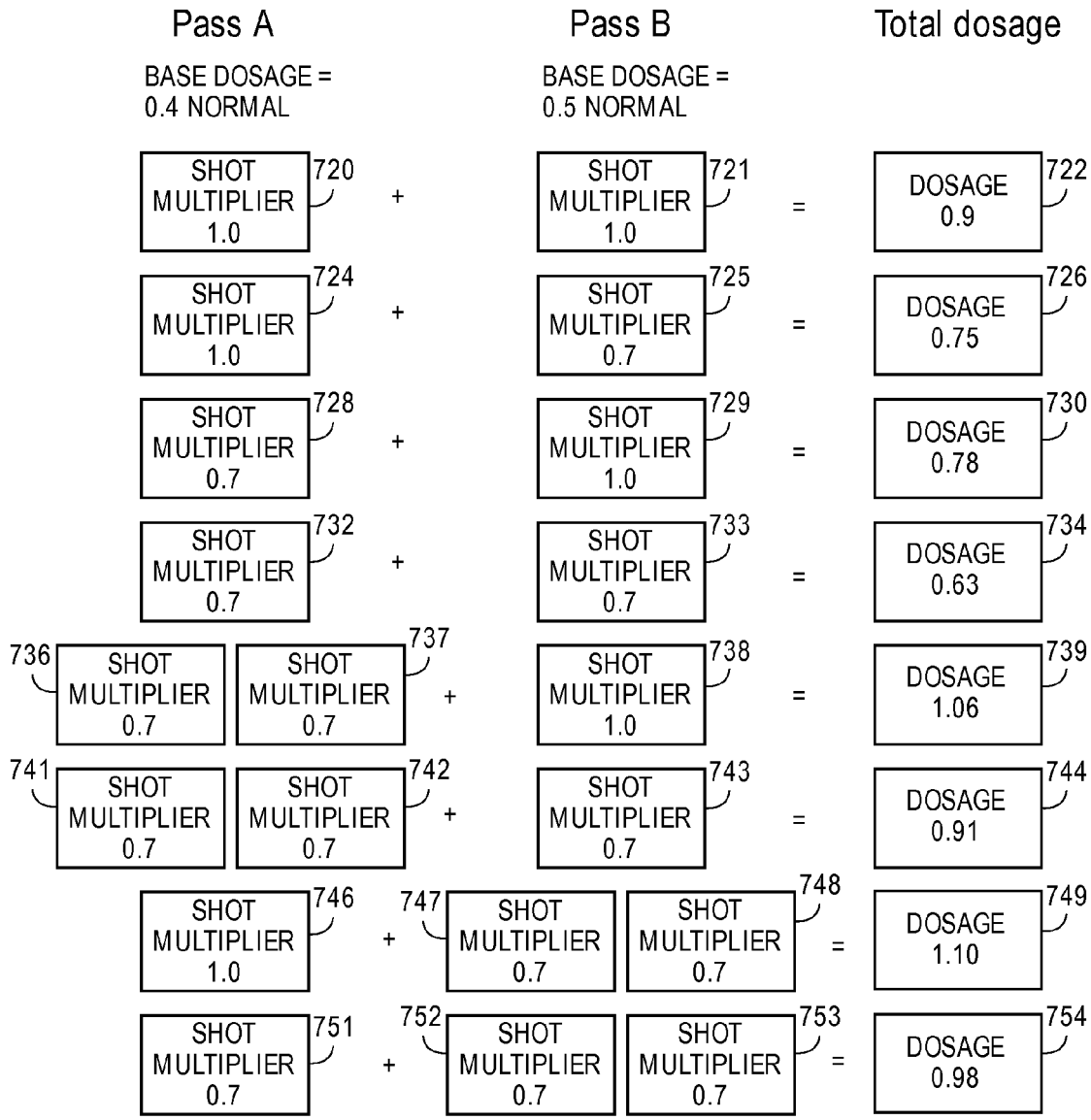
FIG. 7B illustrates eight dosage values that may be obtained with two exposure passes, using overlapping shots from each exposure pass.
Figure 7C:
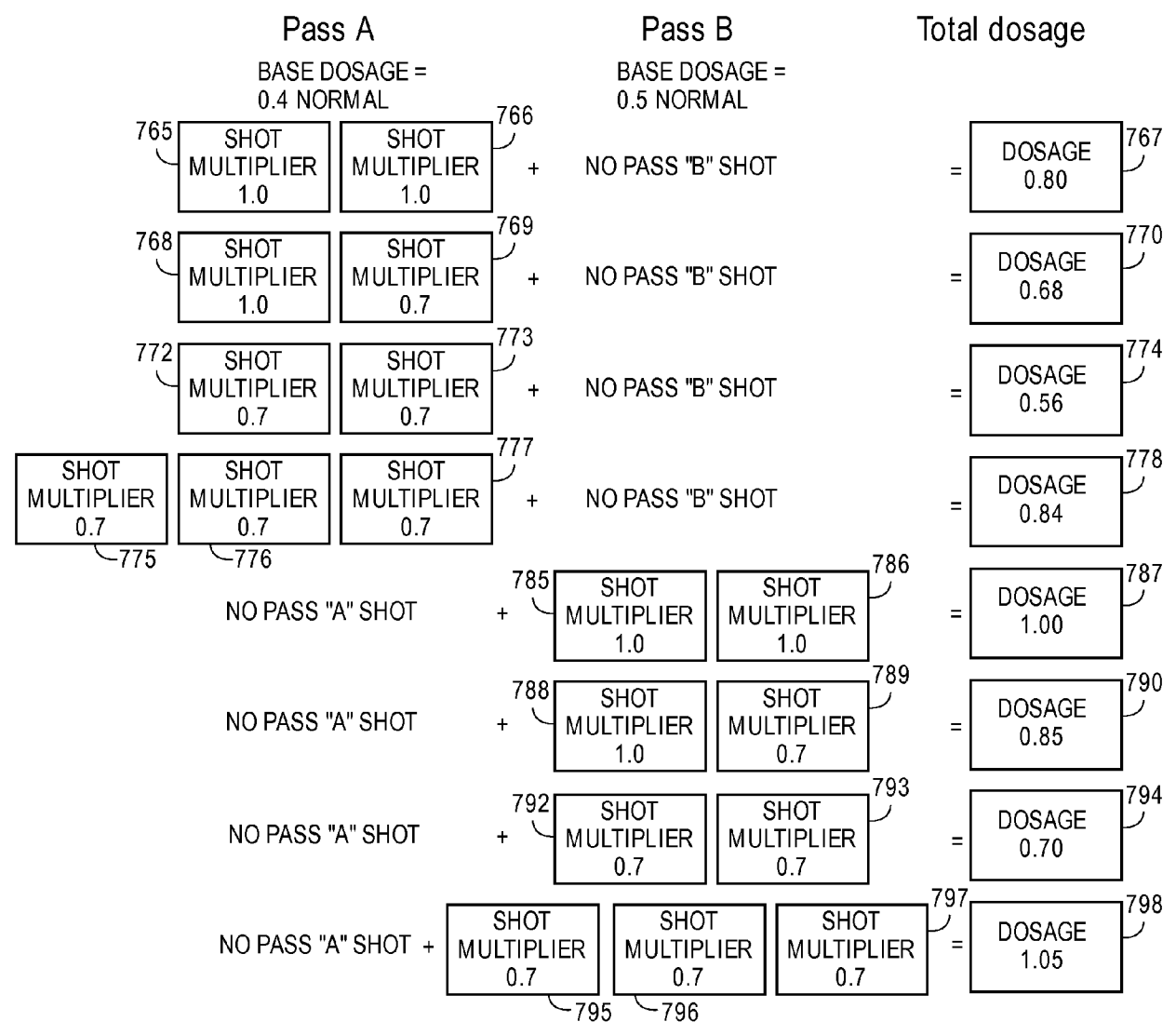

FIGS. 7A-C illustrate another embodiment of the current disclosure in which multiple exposure passes may be used to increase the number of dosage levels available when using a charged particle beam writer which supports a small number of shot dosages. In the FIGS. 7A-C example, the charged particle beam writer allows a shot within an exposure pass to have one of two dosage levels, the shot dosage levels being expressed in this example as a fractional multiple of the base dosage level. In other embodiments, the charged particle beam writer may allow more than two shot dosage levels, such as 4, 8 or 16 shot dosage levels. Also, in other embodiments the shot dosages may be expressed in other ways, such as by an absolute actual dosage which includes effects of the base dosage. Two exposure passes are illustrated in the FIGS. 7A-C example, with exposure pass "A" having a base dosage level of 0.4 times a normal dosage, and exposure pass "B" having a base dosage level of 0.5 times a normal dosage. FIG. 7A illustrates the dosages which are available using a single shot. The shot dosages available within exposure pass "A" are shot 702 with a shot dosage multiplier of 1.0, and shot 704 with a shot dosage multiplier of 0.7. The actual dosage for shot 702 is the base dosage times the shot multiplier, or 0.4*1.0=0.40 times a normal dosage. Similarly, the actual dosage for shot 704 is 0.4*0.7=0.28 times a normal dosage. Exposure pass "B" has a base dosage level of 0.5 times a normal dosage. The shots available within exposure pass "B" are shot 712, with a shot multiplier of 1.0, and shot 714 with a shot multiplier of 0.7. The actual dosage for shot 712 is the base dosage times the shot multiplier, or 0.5*1.0=0.50 times a normal dosage. Similarly, the actual dosage for shot 714 is 0.5*0.7=0.35 times a normal dosage. Note that in the example of FIG. 7A the sum of the base dosage levels is less than a normal dosage. A total of four shot dosages are therefore available with the two passes, using a single shot total between the two passes:

Shot 712: 0.50 times normal dosage
Shot 702: 0.40 times normal dosage
Shot 714: 0.35 times normal dosage
Shot 704: 0.28 times normal dosage These shots may typically be used in overlapping combinations, including partially overlapping combinations, to form a pattern on a resist-covered surface.

FIG. 7B illustrates eight dosages that may be obtained by overlapping at least two shots from FIG. 7A, using at least one shot from pass "A" and at least one shot from pass "B":

- Shot 720 from pass "A" with a shot multiplier of 1.0 and shot 721 from pass "B" with a shot multiplier of 1.0, for a total dosage 722 of (0.4*1.0)+(0.5*1.0)=0.9 times a normal dosage;
- Shot 724 from pass "A" with a shot multiplier of 1.0 and shot 725 from pass "B" with a shot multiplier of 0.7, for a total dosage 726 of (0.4*1.0)+(0.5*0.7)=0.75 times a normal dosage;
- Shot 728 from pass "A" with a shot multiplier of 0.7 and shot 729 from pass "B" with a shot multiplier of 1.0, for a total dosage 730 of (0.4*0.7)+(0.5*1.0)=0.78 times a normal dosage;
- Shot 732 from pass "A" with a shot multiplier of 0.7 and shot 733 from pass "B" with a shot multiplier of 0.7, for a total dosage 734 of (0.4*0.7)+(0.5*0.70=0.63 times a normal dosage;
- Shots 736 and 737 from pass "A", both shots with a shot multiplier of 0.7, and shot 738 from pass "B" with a shot multiplier of 1.0, for a total dosage 739 of (0.4*0.7)+(0.4*0.7)+(0.5*1.0)=1.06 times a normal dosage;
- Shots 741 and 742 from pass "A", both shots with a shot multiplier of 0.7, and shot 743 from pass "B" with a shot multiplier of 0.7, for a total dosage 744 of (0.4*0.7)+(0.4*0.7)+(0.5*0.7)=0.91 times a normal dosage;
- Shot 746 from pass "A" with a shot multiplier of 1.0 and shots 747 and 748 from pass "B", both pass "B" shots with a shot multiplier of 0.7, for a total dosage 749 of (0.4*1.0)+(0.5*0.7)+(0.5*0.7)=1.10 times a normal dosage; and Shot 751 from pass "A" with a shot multiplier of 0.7 and shots 752 and 753 from pass "B", both pass "B" shots with a shot multiplier of 0.7, for a total dosage 754 of (0.4*0.7)+(0.5*0.7)+(0.5*0.7)=0.98 times a normal dosage.

The FIG. 7B shot combinations all include at least one shot from each exposure pass. This provides at least some of the accuracy improvement benefit of conventional multi-pass writing.

FIG. 7C illustrates even more shot combinations of the FIG. 7A shots, but where shots from only one exposure pass are overlapped, thereby providing less accuracy improvement benefit than the shot combinations of FIG. 7B. FIG. 7C combinations include:

Shot 765 from pass "A" with a shot multiplier of 1.0 and shot 766 from pass "A" with a shot multiplier of 1.0, for a total dosage 767 of (0.4*1.0)+(0.4*1.0)=0.80 times a normal dosage;

Shot 768 from pass "A" with a shot multiplier of 1.0 and shot 769 from pass "A" with a shot multiplier of 0.7, for a total dosage 770 of (0.4*1.0)+(0.4*0.7)=0.68 times a normal dosage;

Shot 772 from pass "A" with a shot multiplier of 0.7 and shot 773 from pass "A" with a shot multiplier of 0.7, for a total dosage 774 of (0.4*0.7)+(0.4*07)=0.56 times a normal dosage;

Shot 775 from pass "A" with a shot multiplier of 0.7, and shot 776 from pass "A" with a shot multiplier of 0.7, and shot 777 from pass "A" with a shot multiplier of 0.7, for a total dosage 778 of (0.4*0.7)+(0.4*0.7)+(0.4*0.7)=0.84 times a normal dosage;

Shot 785 from pass "B" with a shot multiplier of 1.0 and shot 786 from pass "B" with a shot multiplier of 1.0, for a total dosage 787 of (0.5*1.0)+(0.5*1.0)=1.0 times a normal dosage;

Shot 788 from pass "B" with a shot multiplier of 1.0 and shot 789 from pass "B" with a shot multiplier of 0.7, for a total dosage 790 of (0.5*1.0)+(0.5*0.7)=0.85 times a normal dosage;

Shot 792 from pass "B" with a shot multiplier of 0.7 and shot 793 from pass "B" with a shot multiplier of 0.7, for a total dosage 794 of (0.5*0.7)+(0.5*0.7)=0.70 times a normal dosage; and Shot 795 from pass "B" with a shot multiplier of 0.7, and shot 796 from pass "B" with a shot multiplier of 0.7, and shot 797 from pass "B" with a shot multiplier of 0.7, for a total dosage 798 of (0.5*0.7)+(0.5*0.7)+(0.5*0.7)=1.05 times a normal dosage.

The availability of shots with a wider dosage variation may allow a reduction in the total shot count required to form a pattern on a resist-coated surface. As the FIGS. 7A-C example illustrates, the use of multiple exposure passes can multiply the number of shot dosage levels available.

Figure 8A:
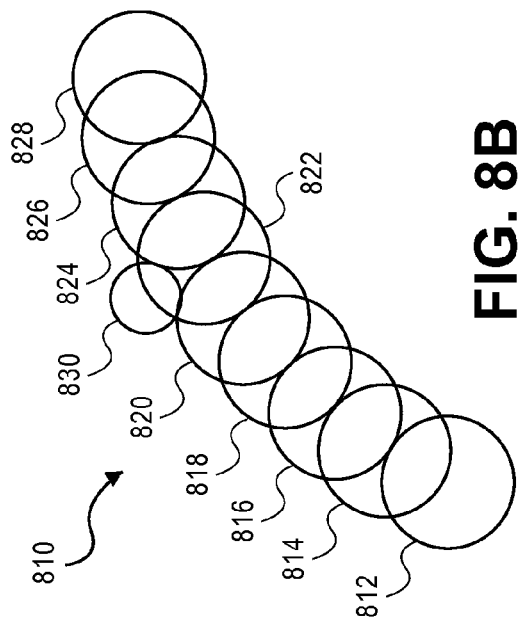
FIG. 8A illustrates a curvilinear pattern.
Figure 8B:
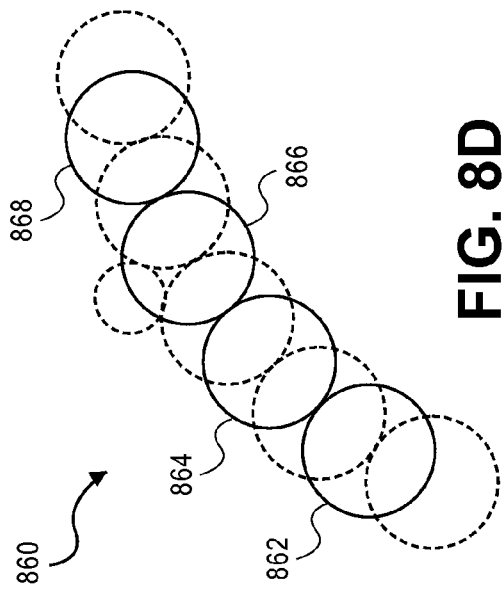
FIG. 8B illustrates a prior art method of forming the pattern of FIG. 8A using overlapping shots.

FIGS. 8A-D illustrate the use of multiple exposure passes to form a curvilinear pattern. FIG. 8A illustrates a curvilinear pattern 800 that is desired to be formed on a resist-covered surface. Pattern 800 is a mostly-constant-width curvilinear path or track, with a bump 802 on the upper side. FIG. 8B illustrates a combination of prior art methods for forming the pattern 802:

The constant-width path or track can be formed with a series of overlapping circular CP shots, nine in this example, consisting of shot 812, shot 814, shot 816, shot 818, shot 820, shot 822, shot 824, shot 826 and shot 828. This method is disclosed in U.S. patent application Ser. No. 12/618,722 filed Nov. 14, 2009, entitled "Method For Fracturing And Forming A Pattern Using Curvilinear Characters With Charged Particle Beam Lithography."

The bump 802 is formed using a differently sized circular CP shot 830 which overlaps shot 822. The use of overlapping CP shots to form a pattern is disclosed in U.S. patent application Ser. No. 12/202,364 filed Sep. 1, 2008, entitled "Method And System For Manufacturing A Reticle Using Character Projection Lithography."

Figure 8C:
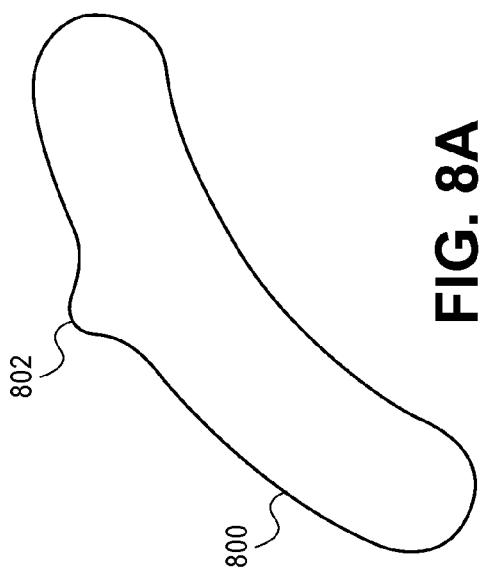
FIG. 8C illustrates non-overlapping shots from a first of two passes that together can form the pattern of FIG. 8A, using an exemplary method of the current disclosure.
Figure 8D:
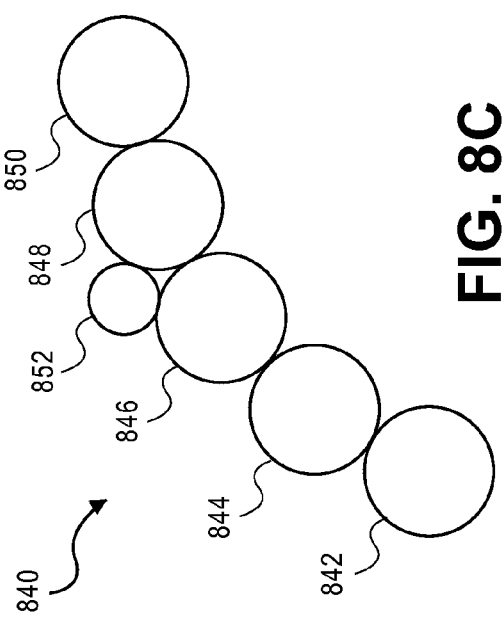
FIG. 8D illustrates non-overlapping shots from a second of two passes that together can form the pattern of FIG. 8A, using an exemplary method of the current disclosure.

The prior art methods illustrated in FIG. 8B require use of a charged particle beam writer that allows overlapping shots. FIG. 8C and FIG. 8D illustrate an exemplary method of how the pattern 800 may be formed using a charged particle beam writer which does not allow shot overlap within an exposure pass, by using two exposure passes, according to the current disclosure, with the two exposure passes in this example being called pass "A" and pass "B". FIG. 8C illustrates outlines of a set of six pass "A" shots 840, including shot 842, shot 844, shot 846, shot 848 and shot 850, each of these shots using an assigned shot multiplier of 0.5. Also shown is shot outline 852, with this shot having a shot multiplier of 1.0. The dosage of shot 852 is higher than the other pass "A" shots, because no pass "B" shot outline overlaps the top of the bump 802. FIG. 8D illustrates outlines of a set of four pass "B" shots 860, including shot 862, shot 864, shot 866 and shot 868. The outlines of shots from pass "A" are shown in dashed lines, so that overlap between pass "A" shot outlines and pass "B" shot outlines can be seen. As can be seen in FIG. 8D, the union of dashed shot outlines for pass "A" shots is different from the union of solid shot outlines for pass "B" shots. Note that pass "B" cannot have a shot corresponding to shot 852 of pass "A", for such a shot would overlap pass "B" shot 866, as can be seen. FIGS. 8C-D illustrate how the shot count reduction benefits of using overlapping shots can be obtained, even when using a charged particle beam writer which does not allow shot overlap within an exposure pass.

Figure 9B:
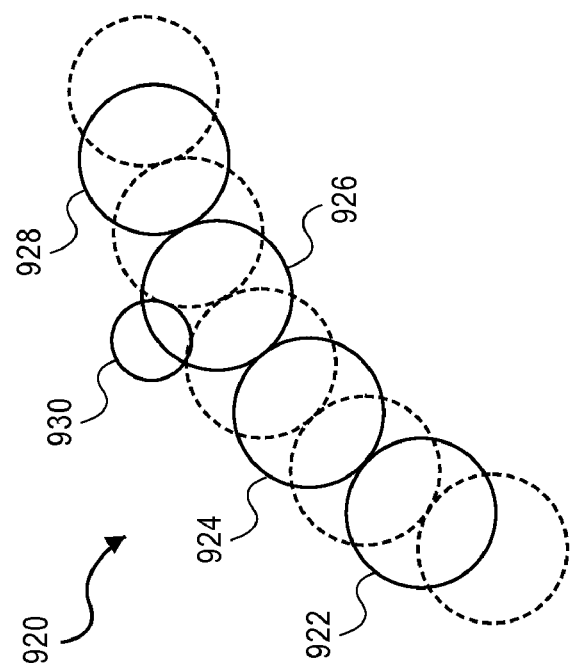
FIG. 9B illustrates unassigned dosage shots from a second of two exposure passes that together can form the pattern of FIG. 8A, using an exemplary method of the current disclosure.
Figure 9A:
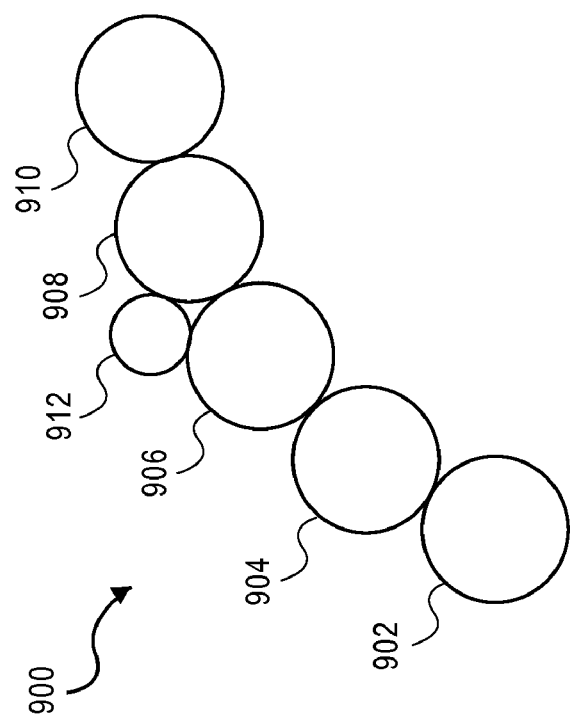
FIG. 9A illustrates unassigned dosage shots from a first of two exposure passes that together can form the pattern of FIG. 8A, using an exemplary method of the current disclosure.

FIGS. 9A-B illustrate an exemplary method for forming pattern 800 using a charged particle beam writer which does not allow shot-by-shot dosage assignment, according to the current disclosure. The example of FIGS. 9A-B uses two exposure passes, called pass "A" and pass "B". FIG. 9A illustrates outlines of a set 900 of six pass "A" shots, including shot 902, shot 904, shot 906, shot 908, shot 910 and shot 912. A pass "A" base dosage of 0.5 times a normal dosage is used in this example. FIG. 9B illustrates outlines of a set 920 of five pass "B" shots, including shot 922, shot 924, shot 926, shot 928 and shot 930. FIG. 9B also shows the shots from pass "A" in dashed lines, so that the overlap between pass "A" shots and pass "B" shots may be seen. A pass "B" base dosage of 0.5 times a normal dosage is used in this example. As can be seen in FIG. 9B, the union of dashed shot outlines for pass "A" shots is different from the union of solid shot outlines for pass "B" shots. Note that shot 930 completely overlaps shot 912, leading to a total dosage of 1.0 times a normal dosage for the bump area 802 of the pattern 800. In this example, the sum of the base dosages for both exposure passes is 0.5+0.5=1.0 times a normal dosage. In another embodiment, the pass "A" base dosage may be 0.6 times a normal dosage and the pass "B" base dosage may be 0.4 times a normal dosage, the sum of the dosages for the two passes therefore also being 1.0 times a normal dosage. In other embodiments, the sum of the base dosages for all the exposure passes may not equal 1.0. For example, two exposure passes may have base dosages of 0.6 and 0.6 times a normal dosage, the sum of the base dosages for the two exposure passes being 1.2 times a normal dosage. In another example, two exposure passes may have base dosages of 0.6 and 0.7 times a normal dosage, the sum of the base dosages for the two exposure passes being 1.3 times a normal dosage. A benefit of having the sum of the dosages for all the exposure passes equal to 1.0 time a normal dosage is that the set of exposure passes may also be used with conventional fracturing. This allows part of the surface to be fractured conventionally, and the rest of the surface to be fractured with overlapping shots, shots with varying assigned dosages or by using different shot lists for different exposure passes, where the union of the shots for different exposure passes is different. FIGS. 9A-B illustrate how shot combinations of varying dosages can be written using a charged particle beam writer which does not provide for shot-by-shot dosage assignment.

The dosage that would be received by a surface can be calculated and stored as a two-dimensional (X and Y) dosage map called a glyph. A two-dimensional dosage map or glyph is a two-dimensional grid of calculated dosage values for the vicinity of the shot or shots comprising the glyph. In some embodiments the dosage map grid may be uniform, while in other embodiments, the dosage map grid may be non-uniform. The calculated dosage map or glyph and the list of shots comprising the glyph can be stored in a library of glyphs. The glyph library can be used as input during fracturing of the patterns in a design. For example, referring again to FIG. 4D, a dosage map may be calculated from the series of shots including shot 410, shot 412 and shot 414, and stored in the glyph library. If during fracturing, one of the input patterns is a pattern of the same shape as pattern 404, then the shots comprising the glyph may be retrieved from the library, avoiding the computational effort of determining an appropriate set of shots to form the input pattern. A series of glyphs may also be combined to create a parameterized glyph. Parameters may be discrete or may be continuous.

Figure 10:
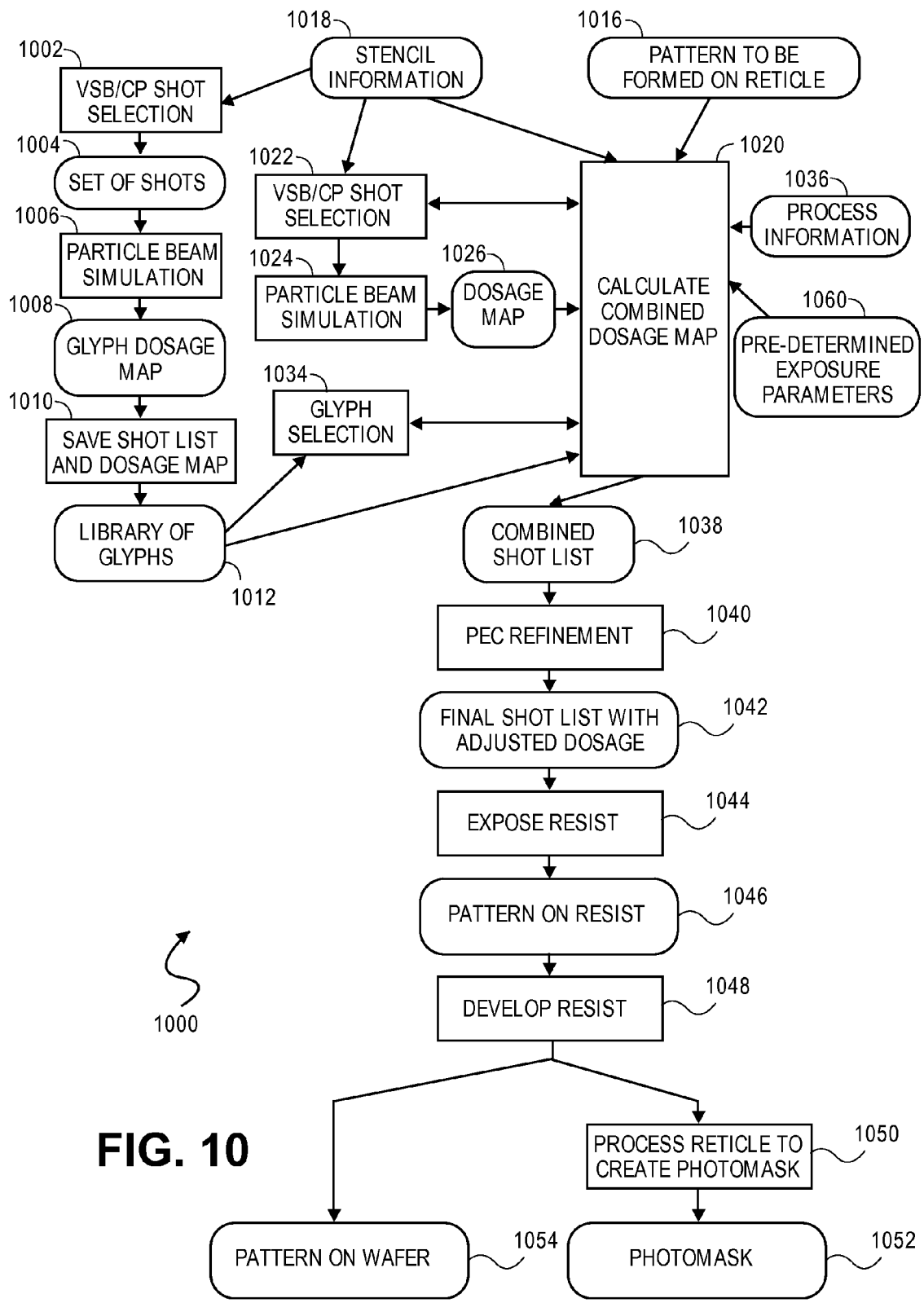
FIG. 10 illustrates a conceptual flow diagram for manufacturing a reticle and photomask, or for exposing a substrate, using an exemplary method of the current disclosure.

FIG. 10 illustrates an exemplary conceptual flow diagram 1000 of a method for forming a pattern on a surface according to the current disclosure. There are four types of input data to the process: stencil information 1018, which is information about the CP characters, if any, on the stencil of the charged particle beam writer; process information 1036, which includes information such as the resist dosage threshold above which the resist will register a pattern; pre-determined exposure parameters 1060, such as the number of exposure passes and the base dosage levels for each pass; and a computer representation of the desired pattern 1016 to be formed on the surface. Parameters 1060 may be given as input, or may be calculated automatically given a pattern 1016. In addition, initial optional steps 1002-1012 involve the creation of a library of glyphs. The first step in the optional creation of a library of glyphs is VSB/CP shot selection 1002, in which one or more VSB or CP shots, each shot either with or without an assigned dosage, are combined to create a set of shots 1004. The set of shots 1004 may include overlapping VSB shots and/or overlapping CP shots. Shots in the set of shots may also have a beam blur specified. The VSB/CP shot selection step 1002 uses the stencil information 1018, which includes information about the CP characters that are available on the stencil. The set of shots 1004 is simulated in step 1006 using charged particle beam simulation to create a dosage map 1008 of the set of shots. Step 1006 may include simulation of various physical phenomena including forward scattering, resist diffusion, Coulomb effect, etching, fogging, loading, resist charging, and backward scattering. The result of step 1006 is a two-dimensional dosage map 1008 which represents the combined dosage from the set of shots 1004 at each of the grid positions in the map. The dosage map 1008 is called a glyph. In step 1010 the information about each of the shots in the set of shots, and the dosage map 1008 of this additional glyph is stored a library of glyphs 1012. In one embodiment, a set of glyphs may be combined into a type of glyph called a parameterized glyph.

The required portion of the flow 1000 involves writing a pattern to a surface, such as a silicon wafer or a reticle used for creation of a photomask. In step 1020 a combined dosage map for the surface or for a portion of the surface is calculated. Step 1020 uses as input the desired pattern 1016 to be formed on the surface, the process information 1036, the pre-determined exposure parameters 1060, the stencil information 1018, and the glyph library 1012 if a glyph library has been created. In step 1020 an initial surface dosage map may be created, into which the shot dosage maps will be combined. Initially, the surface dosage map contains no shot dosage map information. In one embodiment, the grid squares of the surface dosage map may be initialized with an estimated correction for long-range effects such as backscattering, fogging, or loading, a term which refers to the effects of localized resist developer depletion. Step 1020 may involve VSB/CP shot selection 1022, or glyph selection 1034, or both of these. Step 1020 may also involve assignment of a shot to one of a plurality of exposure passes. If shot dosages are allowed, then the shot dosage may be expressed as a fractional multiple of the base dosage. If a VSB or CP shot is selected, the shot is simulated using charged particle beam simulation in step 1024 and a dosage map 1026 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. Both VSB and CP shots may be allowed to overlap, and may have varying dosages with respect to each other, subject to constraint by the predetermined exposure parameters 1060. If a glyph is selected, the dosage map of the glyph is input from the glyph library. In step 1020, the various dosage maps of the shots and/or glyphs are combined into the surface dosage map. In one embodiment, the combination is done by adding the dosages. Using the resulting combined dosage map, the predetermined exposure parameters 1060, and the process information 1036 containing resist characteristics, a surface pattern may be calculated. If the calculated surface pattern matches the desired pattern 1016 within a pre-determined tolerance, then a combined shot list 1038 is output, containing the determined VSB/CP shots and the shots constituting the selected glyphs. If the calculated surface pattern does not match the target pattern 1016 within a predetermined tolerance as calculated in step 1020, the set of selected CP shots, VSB shots and/or glyphs may be revised, the dosage maps may be recalculated, and the surface pattern may be recalculated. In one embodiment, the initial set of shots and/or glyphs may be determined in a correct-by-construction method, so that no shot or glyph modifications are required. In another embodiment, step 1020 includes an optimization technique so as to minimize either the total number of shots represented by the selected VSB/CP shots and glyphs, or the total charged particle beam writing time, or some other parameter. In yet another embodiment, VSB/CP shot selection 1022 and glyph selection 1034 are performed so as to generate multiple sets of shots, each of which can form a surface image that matches the desired pattern 1016, but at a lower-than-normal dosage, to support multi-pass writing.

The combined shot list 1038 comprises the determined list of selected VSB shots, selected CP shots and shots constituting the selected glyphs. The shots in the final shot list 1038 may include assigned dosages, or may have unassigned shot dosages. Shots may also include a beam blur specification. In step 1040, proximity effect correction (PEC) and/or other corrections may be performed or corrections may be refined from earlier estimates. Thus, step 1040 uses the combined shot list 1038 as input and produces a final shot list 1042 in which the shot dosages have been adjusted, either from the assigned shot dosage or, for unassigned dosage shots, the base dosage. The group of steps from step 1020 through step 1042, or subsets of this group of steps, are collectively called fracturing or mask data preparation. The final shot list 1042 is used by the charged particle beam writer in step 1044 to expose resist with which the surface has been coated, thereby forming a pattern 1046 on the resist. In step 1048 the resist is developed. In the case where the surface is the surface of a wafer, the development of the resist forms a pattern 1054 on the wafer surface. In the case where the surface is a reticle, further processing steps 1050 are performed to transform the reticle with the pattern into a photomask 1052.

The fracturing, mask data preparation, proximity effect correction, and pattern writing flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the optimization and simulation processes described in this disclosure may include iterative processes of revising and recalculating possible solutions, so as to minimize either the total number of shots, or the total charged particle beam writing time, or some other parameter. In another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, manufacturing a surface, and manufacturing an integrated circuit may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or proximity effect correction for charged particle beam lithography comprising:
    setting a base dosage level for each of a plurality of exposures passes, wherein the base dosage levels for at least two of the exposure passes are different; and
    determining a plurality of shots for each of the plurality of exposure passes, wherein all shots for each exposure pass in the plurality of exposure passes are selected from the group consisting of variable shaped beam (VSB) shots and character projection (CP) shots.

2. The method of claim 1 wherein shots in the plurality of shots for each of the plurality of exposure passes have unassigned shot dosages.

3. The method of claim 1 wherein shots in the plurality of shots for each of the plurality of exposure passes have assigned shot dosages.

4. The method of claim 3 wherein for each of the plurality of exposure passes, the assigned shot dosages are expressed as fractional multiples of the base dosage.

5. The method of claim 3 wherein the assigned shot dosages may have one of less than 17 dosage levels.

6. The method of claim 1 wherein the sum of the base dosage levels for all the exposure passes equals a normal dosage.

7. The method of claim 1 wherein shots in a subset of the plurality of shots in at least one of the plurality of exposure passes overlap each other.

8. The method of claim 1 wherein for an exposure pass in the plurality of exposure passes, shots in the plurality of shots are disjoint.

9. The method of claim 1 wherein the step of determining comprises using charged particle beam simulation.

10. The method of claim 9 wherein the charged particle beam simulation includes at least one of the group consisting of forward scattering, backward scattering, resist diffusion, Coulomb effect, etching, fogging, loading and resist charging.

11. A method for forming a set of patterns on a surface using charged particle beam lithography comprising:
    a) setting a base dosage level for an exposure pass;
    b) exposing a plurality of shots for the exposure pass using the set base dosage level, wherein all shots in the plurality of shots for the exposure pass are selected from the group consisting of variable shaped beam (VSB) shots and character projection (CP) shots; and
    c) repeating steps a) and b) for at least one additional exposure pass,
    wherein the sum of the pluralities of shots for all of the exposure passes can form the set of patterns on the surface, and wherein the base dosage levels for at least two of the exposure passes are different.

12. The method of claim 11, further comprising using a charged particle beam writer that supports only unassigned shot dosage input shots.

13. The method of claim 11 wherein in the step of exposing, shots in the plurality of shots for the exposure pass have assigned shot dosages.

14. The method of claim 13 wherein the assigned shot dosages are expressed as fractional multiples of the base dosage.

15. The method of claim 13, further comprising using a charged particle beam writer that supports as input data only shots having less than 17 shot dosage levels.

16. The method of claim 11 wherein the sum of the base dosage levels for all the exposure passes equals a normal dosage.

17. The method of claim 11 wherein in the step of exposing, shots in a subset of the plurality of shots overlap each other, for at least one of the exposure passes.

18. The method of claim 11, further comprising using a charged particle beam writer that supports only disjoint shots within an exposure pass.

19. The method of claim 11 wherein the surface is a semiconductor wafer, the method further comprising using the set of patterns on the wafer to manufacture an integrated circuit.

20. A method for manufacturing an integrated circuit using an optical lithographic process, the optical lithographic process using a reticle, the method comprising:
   a) providing a charged particle beam source;
   b) setting a base dosage level for an exposure pass;
   c) exposing a plurality of shots for the exposure pass using the set base dosage level, wherein all shots in the plurality of shots for the exposure pass are selected from the group consisting of variable shaped beam (VSB) shots and character projection (CP) shots; and
   d) repeating steps b) and c) for at least one additional exposure pass,
   wherein the sum of the pluralities of shots for all of the exposure passes can form a set of desired patterns on the reticle, and wherein the base dosage levels for at least two of the exposure passes are different.

21. The method of claim 20, further comprising using a charged particle beam writer that supports only unassigned shot dosage input shots.

22. The method of claim 20 wherein the sum of the base dosage levels for all the exposure passes equals a normal dosage.

23. The method of claim 20, further comprising using a charged particle beam writer that supports only disjoint shots within an exposure pass.

24. A system for fracturing or mask data preparation or proximity effect correction for use with shaped beam charged particle beam lithography comprising:
   an input device capable of receiving a set of patterns to be formed on a surface;
   a computation device capable of determining a set of shots that can be used to form the set of patterns using a plurality of exposure passes, wherein each exposure pass has a base dosage level, and wherein the base dosage levels for at least two of the exposure passes are different, and wherein all shots in the set of shots are selected from the group consisting of variable shaped beam (VSB) shots and character projection (CP) shots; and
   an output device capable of outputting the determined set of shots.

25. The system of claim 24, wherein shots in the set of shots that can be determined by the computation device have unassigned shot dosages.

* * * * *